(12) United States Patent
Toyoshima et al.

(10) Patent No.: US 6,633,487 B1
(45) Date of Patent: Oct. 14, 2003

(54) METHOD FOR MANUFACTURING HYBRID CIRCUIT BOARD

(75) Inventors: Akihiko Toyoshima, Kashima-Gun (JP); Kunihiko Azeyanagi, Kashima (JP)

(73) Assignee: Nippon Mektron, Ltd., Tokyo (JP)

( * ) Notice: Subject to any disclaimer, the term of this patent is extended or adjusted under 35 U.S.C. 154(b) by 309 days.

(21) Appl. No.: 09/679,993

(22) Filed: Oct. 5, 2000

(30) Foreign Application Priority Data

Oct. 5, 1999 (JP) .......................................... 11-284240

(51) Int. Cl.[7] ................................................ H05K 1/00
(52) U.S. Cl. ...................... 361/749; 361/750; 361/751; 361/792; 361/761; 361/795
(58) Field of Search ................................ 361/760, 761, 361/749, 750, 751, 792, 795, 820, 250, 174; 257/684; 439/493

(56) References Cited

U.S. PATENT DOCUMENTS 5,295,214 A * 3/1994 Card et al.
5,822,194 A * 10/1998 Horiba et al. ................ 257/684

* cited by examiner

Primary Examiner—George Fourson
Assistant Examiner—Khiem Nguyen
(74) Attorney, Agent, or Firm—Alix, Yale & Ristas, LLP

(57) ABSTRACT

A required interlayer circuit board 1 is constituted so as to provide a punched portion in which only a collapsible cable portion 2 for connecting a plurality of component mounting portions to each other is exposed. An external layer board 6 is superimposed on at least one side of the internal layer circuit board 1 through an adhesive member 4 to which an opening portion 5 is formed at a position corresponding to the cable portion 2, the external layer substrate 6 having an opening portion 7 at a similar position. Thereafter, a wiring pattern for the component mounting portions is formed on the external layer board 6, and a blank and pierce process of the respective component mounting portions except the cable portion is carried out, thereby integrally connecting a plurality of the component mounting portions to each other through the collapsible cable portion.

16 Claims, 2 Drawing Sheets

METHOD FOR MANUFACTURING HYBRID CIRCUIT BOARD

BACKGROUND OF THE INVENTION

1. Field of the Invention

The present invention relates to a method for manufacturing a circuit board for use in an electronic device, and more particularly to a method for manufacturing a hybrid circuit board which is a multilayer circuit board in which the high-density wiring is required and a plurality of component mounting portions are connected to each other by a flexible cable portion.

2. Description of the Related Art

Although a circuit board has electronic component mounted thereon and is installed in various electronic devices, it is often the case that three-dimensional component mounting is required in order to realize a compact electronic device. Therefore, a technique for folding a circuit board and the like is needed.

In order to realize the three-dimensional component mounting, there is adopted a technique using a circuit board consisting of, e.g., a material which can be folded or using a hybrid circuit board in which electronic components are mounted on a plurality of circuit boards and these circuit boards are connected to each other by a collapsible cable portion.

However, the technique using the circuit board consisting of the above-described collapsible material increases a number of wiring patters to be folded in case of a multilayer circuit board and the like to make it difficult to fold, and there is such a undesirable problem as that connectivity of the through-hole plating and the like is deteriorated by the fold.

On the other hand, in case of the hybrid circuit board for connecting the circuit boards to each other through the collapsible cable portion, a terminal portion must be provided for connecting the cable portion and a space for that portion must be assured. Also, a trouble for connecting soldering and the like is required, which degrades the working property.

SUMMARY OF THE INVENTION

It is therefore an object of the present invention to provide a method for manufacturing a hybrid circuit board capable of integrally forming a component mounting portion and a cable portion by previously forming a punched-out opening portion to a circuit board at a part corresponding a collapsible cable portion when manufacturing the hybrid circuit board for connecting a plurality of circuit boards having electronic components mounted thereon to each other through the collapsible cable portion.

To achieve this aim, a method for manufacturing a hybrid circuit board according to the present invention adopts a technique for integrally connecting a plurality of component mounting portions through a collapsible cable portion by constituting a required internal circuit board so as to provide a punched portion in which only a collapsible cable portion for, e.g., a flexible circuit board for connecting a plurality of component mounting portions to each other is exposed, superimposing on at least one side of the internal layer circuit board an external layer board having an opening portion through an adhesive member having each opening formed at a portion corresponding to said cable portion, and thereafter forming a wiring pattern for the component mounting portions to the external layer board to carry out a blank and pierce process of the respective component mounting portions.

Here, a one-sided copper-clad laminate can be used for the external board, and a pre-preg or an interlayer adhesive can be used for the adhesive member. On the other hand, a required through-hole portion can be formed between the internal circuit board and the external board without restraint.

DESCRIPTION OF THE PREFERRED EMBODIMENT

Figure 1:
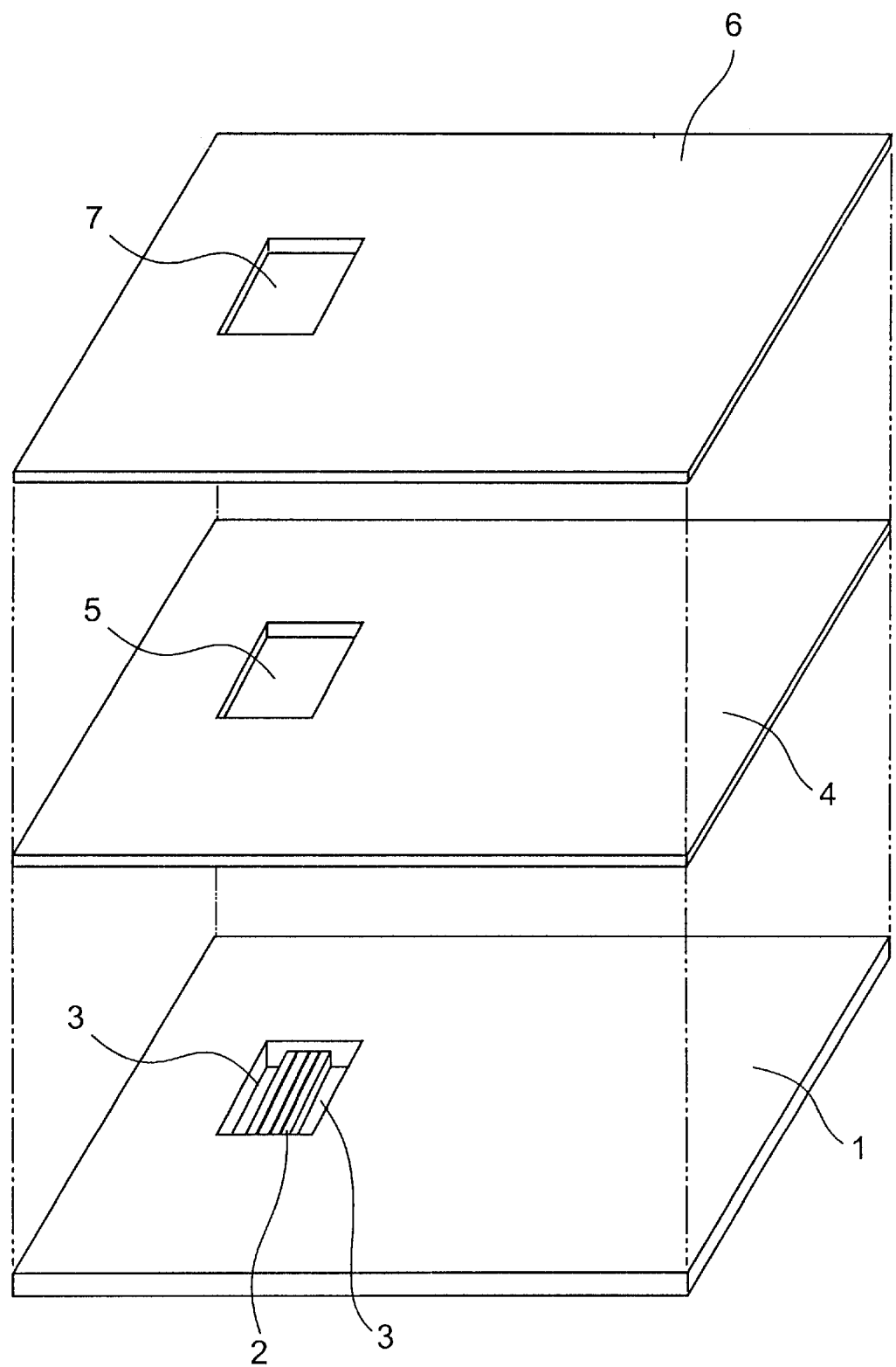
FIG. 1 is a layout drawing of members for conceptually explaining a method for manufacturing a hybrid circuit board according to the present invention.

The present invention will now be described in detail hereinafter with reference to an illustrative embodiment. FIG. 1 is a layout drawing of members for conceptually explaining a method for manufacturing a hybrid circuit board according to the present invention. In the drawing, an internal layer circuit board 1 has such a structure as that a required wiring pattern is formed at a position corresponding to a non-illustrated component mounting portion including a flexible circuit board which is a collapsible cable portion 2 and a necessary position of this wiring pattern is electrically connected to the flexible circuit board in advance.

The cable portion 2 constituted by a part of the flexible circuit board is arranged on the upper or lower surface of or in the internal layer circuit board 1 according to need. At all events, an opening for exposing solely the cable portion 2 is formed, and punching portions 3 having a required width are formed on the both sides of the cable portion 2 in order to facilitate the later-described punching process.

An external layer substrate 6 consisting of a one-sided copper-clad laminate is superimposed and bonded on at least one side of the internal layer circuit board 1, to which the cable 2 is integrally formed in advance as described above, by using an adhesive member 4 composed of a pre-preg or an interlayer adhesive having a punched opening portion 5 at a corresponding position which has a shape equivalent to the size of the exposed cable portion 2 including the.p-unched portion 3. Here, an opening portion 7 which has a required size for exposing the cable portion 2 is previously formed to the external layer substrate 6 as similar to the adhesive member 4.

Although not illustrated, this external layer board 6 can be superimposed on the other side of the internal layer circuit board 1 so as to expose the cable portion 2 by the above-described technique according to need, and this can consequently prepare for configuring the circuit board having a multilayer structure of at least three to six layers which is advantageous for the high-density wiring.

Therefore, a necessary through-hole conduction portion is formed between the external layer board 6 and the internal layer circuit board 1 while appropriately covering the region of the exposed cable portion 2, and the required wiring pattern for the component mounting portions can be appropriately formed.

Figure 2:
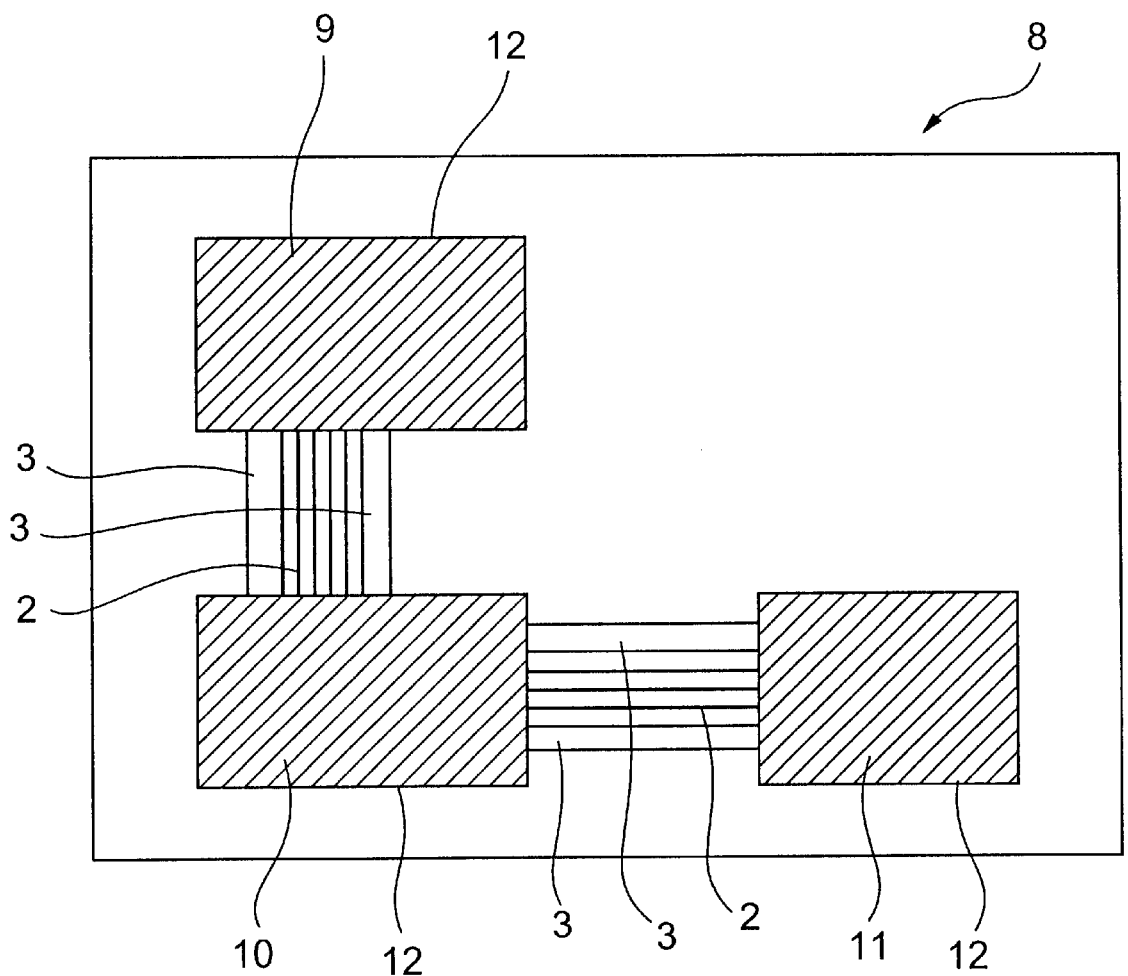
FIG. 2 is a conceptual plan layout drawing of a hybrid circuit board for integrally electrically connecting a plurality of component mounting portions through an exposed cable portion.

FIG. 2 is a conceptual plan layout drawing showing a hybrid circuit board for integrally electrically connecting three component mounting portions 9, 10 and 11 having the high-density multilayered wiring formed by the above-mentioned technique to each other through the exposed cable portion 2, and such a hybrid circuit board can be formed to be divided multiple circuit boards in a laminated circuit board assembly 8.

In order to separate the respective hybrid circuit boards from the laminated circuit board assembly 8, the punching out process is performed along a visible outline 12 of the respective component mounting portions 9, 10 and 11 except each cable portion 2. Accordingly, it is possible to readily obtain the hybrid circuit board in which the component mounting portions 9, 10 and the component mounting portions 10 and 11 are integrally electrically connected to each other through each cable portion 2 in advance.

According to the method for manufacturing the hybrid circuit board of the present invention, in the hybrid circuit board for three-dimensionally mounting the component mounting portions on the electronic device by using the collapsible cable portion, the cable portions can be formed integrally with the component mounting portions in a series of manufacturing processes while eliminating a conventional problem of connecting a plurality of component mounting portions by the troublesome means such as soldering. Further, the hybrid circuit board can be preferably obtained without damaging the cable portion when punching out the component mounting portions. Thus, it is optimum as a technique for manufacturing the hybrid circuit board in which the three-dimensional folding layout is required and the high-density mounting is desired.

What is claimed is:

1. A method for manufacturing a hybrid circuit board for integrally connecting a plurality of component mounting portions to each other through a collapsible cable portion comprising the steps of: constituting a required internal layer circuit board so as to provide a punched portion in which only a collapsible cable portion for connecting a plurality of said component mounting portions to each other is exposed; superimposing an external layer board having an opening portion on at least one side of said internal layer circuit board through an adhesive member having said each opening portion formed at a position corresponding to said cable portion; and thereafter forming a wiring pattern for said component mounting portions to said external layer board to carry out a blank and pierce process of said respective component mounting portions except said cable portion.

2. The method for manufacturing a hybrid circuit board according to claim 1, wherein said cable portion is formed by a flexible circuit board.

3. The method for manufacturing a hybrid circuit board according to claim 1, wherein a one-sided copper-clad laminate is used for said external layer board.

4. The method for manufacturing a hybrid circuit board according to claim 2, wherein a one-sided copper-clad laminate is used for said external layer substrate.

5. The method for manufacturing a hybrid circuit board according to claim 1, wherein a pre-preg or an interlayer adhesive is used for said adhesive member.

6. The method for manufacturing a hybrid circuit board according to claim 2, wherein a pre-preg or an interlayer adhesive is used for said adhesive member.

7. The method for manufacturing a hybrid circuit board according to claim 3, wherein a pre-preg or an interlayer adhesive is used for said adhesive member.

8. The method for manufacturing a hybrid circuit board according to claim 4, wherein a pre-preg or an interlayer adhesive is used for said adhesive member.

9. The method for manufacturing a hybrid circuit board according to claim 1, wherein a required through-hole conduction portion is formed between said internal layer circuit board and said external layer board.

10. The method for manufacturing a hybrid circuit board according to claim 9, wherein said cable portion is formed by a flexible circuit board.

11. The method for manufacturing a hybrid circuit board according to claim 9, wherein a one-sided copper-clad laminate is used for said external layer board.

12. The method for manufacturing a hybrid circuit board according to claim 10, wherein a one-sided copper-clad laminate is used for said external layer substrate.

13. The method for manufacturing a hybrid circuit board according to claim 9, wherein a pre-preg or an interlayer adhesive is used for said adhesive member.

14. The method for manufacturing a hybrid circuit board according to claim 10, wherein a pre-preg or an interlayer adhesive is used for said adhesive member.

15. The method for manufacturing a hybrid circuit board according to claim 11, wherein a prep-preg or an interlayer adhesive is used for said adhesive member.

16. The method for manufacturing a hybrid circuit board according to claim 12, wherein a pre-preg or an interlayer adhesive is used for said adhesive member.

* * * * *

UNITED STATES PATENT AND TRADEMARK OFFICE
CERTIFICATE OF CORRECTION

PATENT NO. : 6,633,487 B1
DATED : October 14, 2003
INVENTOR(S) : Toyoshima et al.

It is certified that error appears in the above-identified patent and that said Letters Patent is hereby corrected as shown below:

Column 3,
Line 41, delete "said each" and replace with -- an --.
Line 42, delete "corresponding" and replace with -- overlapping --.

Signed and Sealed this

Twenty-eighth Day of December, 2004

JON W. DUDAS
*Director of the United States Patent and Trademark Office*